US012362180B2

(12) United States Patent
Chen et al.

(10) Patent No.: US 12,362,180 B2
(45) Date of Patent: *Jul. 15, 2025

(54) METHOD OF MANUFACTURING SEMICONDUCTOR DEVICES

(71) Applicant: Taiwan Semiconductor Manufacturing Company, Ltd., Hsinchu (TW)

(72) Inventors: Chin-Ta Chen, Hsinchu (TW); Hua-Tai Lin, Hsinchu (TW); Han-Wei Wu, Tainan (TW); Jiann-Yuan Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/605,141

(22) Filed: Mar. 14, 2024

(65) Prior Publication Data

US 2024/0234143 A1    Jul. 11, 2024

Related U.S. Application Data

(63) Continuation of application No. 17/175,366, filed on Feb. 12, 2021, now Pat. No. 11,961,738.

(51) Int. Cl.
*H01L 21/027* (2006.01)
*H01L 21/3213* (2006.01)

(52) U.S. Cl.
CPC .... *H01L 21/0274* (2013.01); *H01L 21/32139* (2013.01)

(58) Field of Classification Search
CPC .......... H01L 21/0274; H01L 21/32139; H01L 21/0337; H01L 21/31144; H01L 21/31116; H01L 21/32136
USPC ......................................... 438/702; 430/311
See application file for complete search history.

(56) References Cited

U.S. PATENT DOCUMENTS

| 5,032,491 | A | 7/1991 | Okumura et al. |
| 11,508,580 | B2 | 11/2022 | Yamauchi et al. |
| 11,961,738 | B2* | 4/2024 | Chen ................. H01L 21/32139 |
| 2015/0323866 | A1 | 11/2015 | Namai et al. |

(Continued)

FOREIGN PATENT DOCUMENTS

TW    201928517 A    7/2019

OTHER PUBLICATIONS

Non-Final Office Action issued in U.S. Appl. No. 17/175,366 dated Jun. 21, 2023.

(Continued)

*Primary Examiner* — Caleen O Sullivan
(74) *Attorney, Agent, or Firm* — STUDEBAKER BRACKETT PLLC

(57) ABSTRACT

In a method of forming a pattern, a first pattern is formed over an underlying layer, the first pattern including main patterns and a lateral protrusion having a thickness of less than 25% of a thickness of the main patterns, a hard mask layer is formed over the first pattern, a planarization operation is performed to expose the first pattern without exposing the lateral protrusion, a hard mask pattern is formed by removing the first pattern while the lateral protrusion being covered by the hard mask layer, and the underlying layer is patterned using the hard mask pattern as an etching mask.

20 Claims, 11 Drawing Sheets

(56) References Cited

U.S. PATENT DOCUMENTS

2019/0348292 A1 11/2019 Dutta et al.
2020/0124972 A1 4/2020 Meli Thompson et al.
2020/0273704 A1 8/2020 Park et al.

OTHER PUBLICATIONS

Final Office Action issued in U.S. Appl. No. 17/175,366 dated Sep. 28, 2023.
Notice of Allowance issued in U.S. Appl. No. 17/175,366 dated Dec. 14, 2023.

* cited by examiner

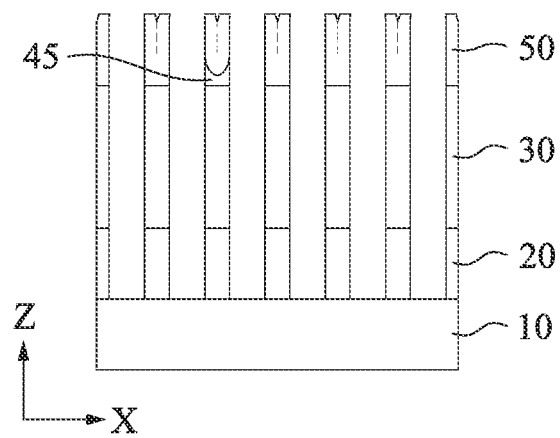 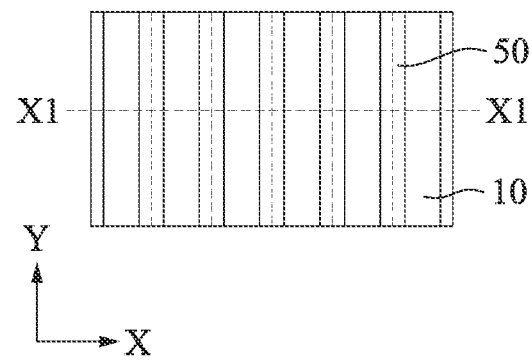
FIG. 7A  FIG. 7B
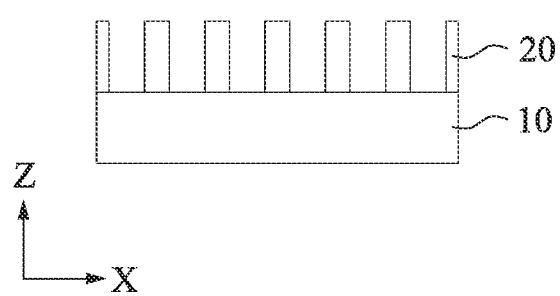 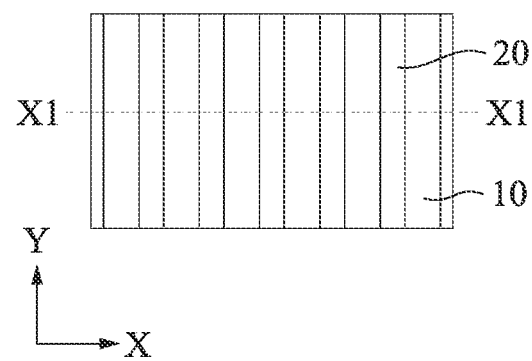
FIG. 8A  FIG. 8B

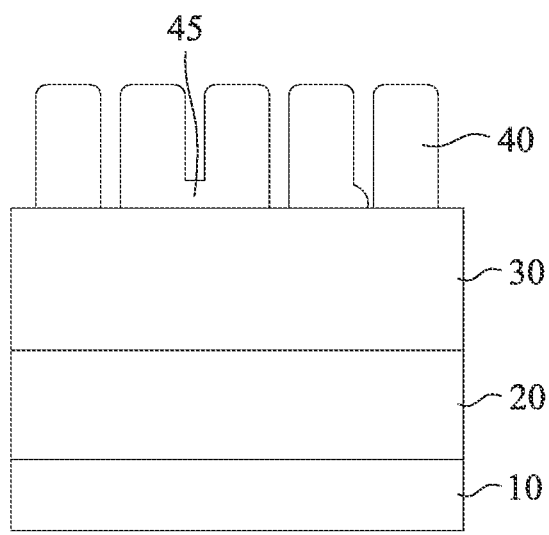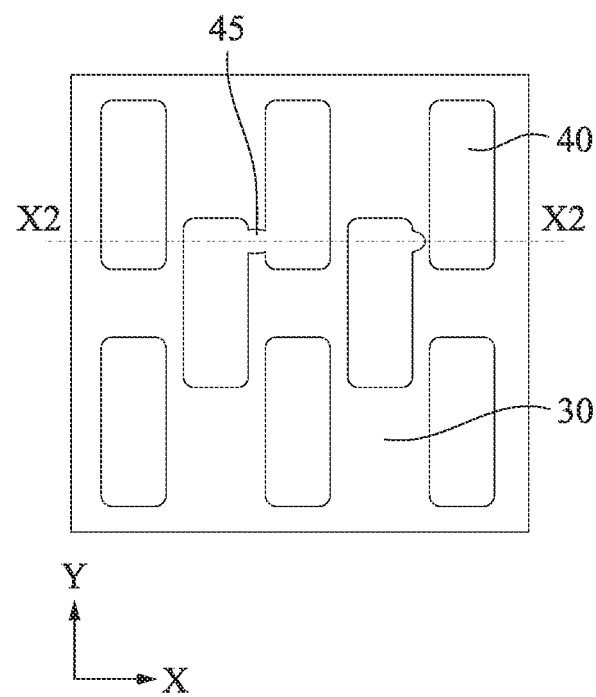
FIG. 9A  FIG. 9B
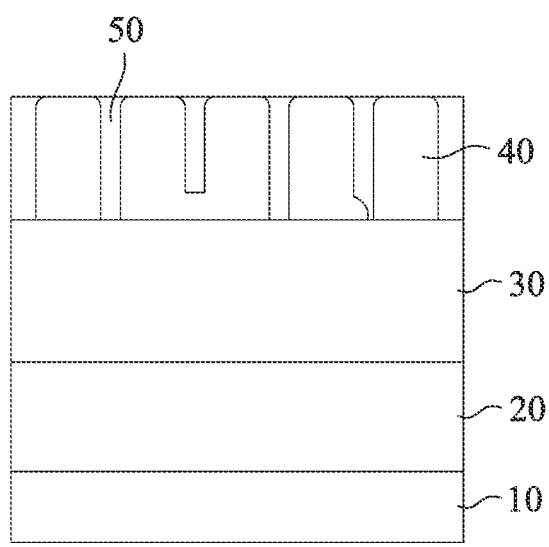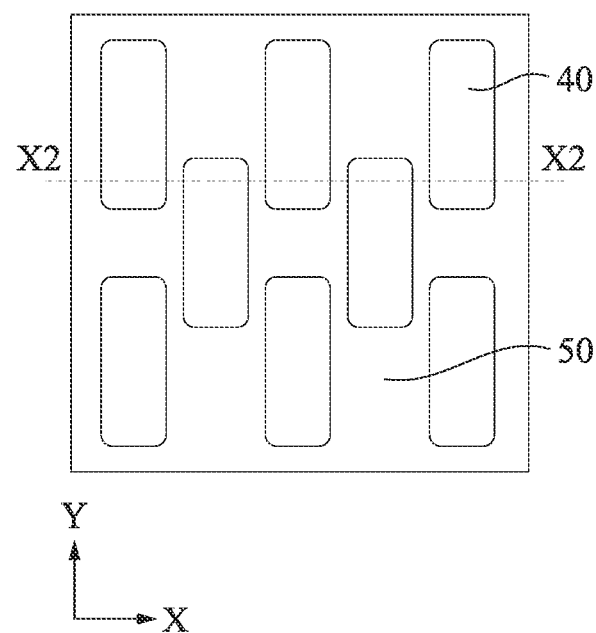
FIG. 10A  FIG. 10B

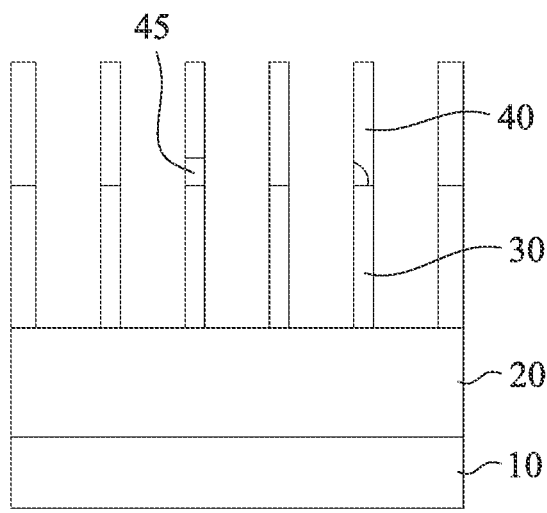 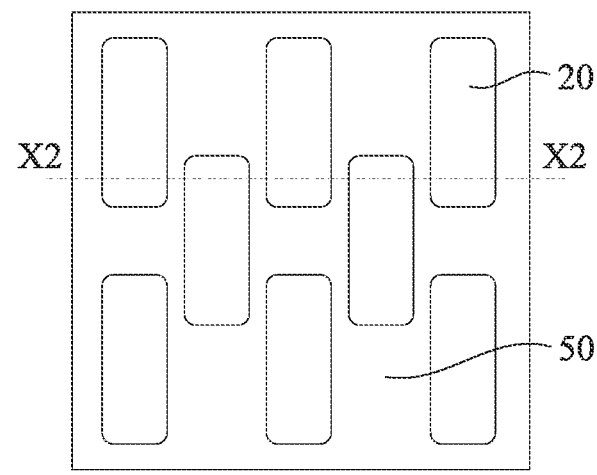
FIG. 11A  FIG. 11B
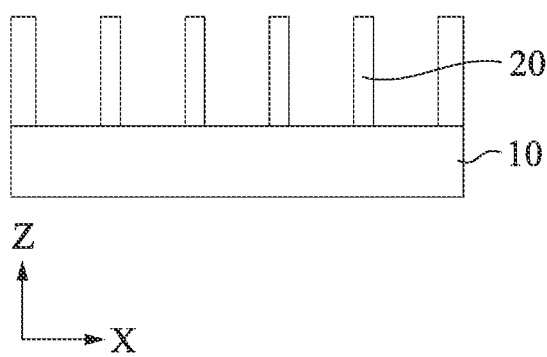 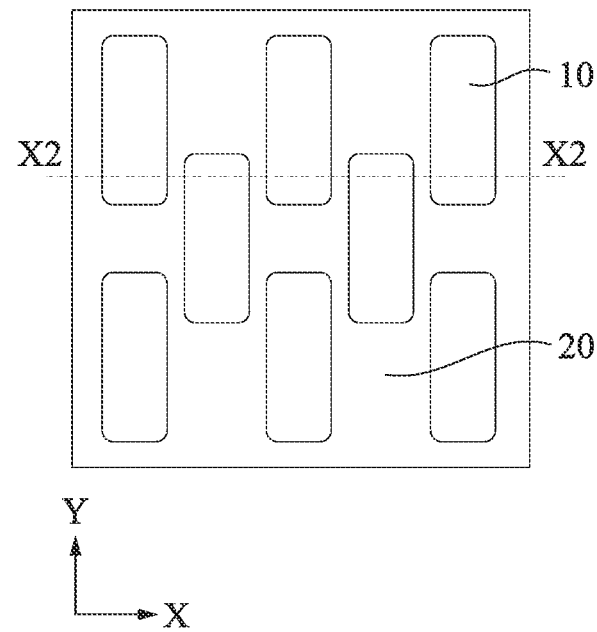
FIG. 12A  FIG. 12B

METHOD OF MANUFACTURING SEMICONDUCTOR DEVICES

RELATED APPLICATION

This is a continuation application of U.S. application Ser. No. 17/175,366, filed Feb. 12, 2021, now U.S. Pat. No. 11,961,738, the entire content of which is incorporated herein by reference.

BACKGROUND

At semiconductor technology nodes of 7 nm or smaller, line-and-space (L/S) patterning requires pitch resolution in optical lithography smaller than about 32 nm. In general, even if extreme ultra violet (EUV) lithography is employed, the resolution limitation by EUV single-exposure technology is about 28 nm to about 34 nm.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2A, 2B, 3, 4A, 4B, 5A, 5B, 6A, 6B, 7A, 7B, 8A and 8B show various stages of a sequential operation of a pattern formation method according to an embodiment of the present disclosure.

FIGS. 9A, 9B, 10A, 10B, 11A, 11B, 12A and 12B show various stages of a sequential operation of a pattern formation method according to an embodiment of the present disclosure.

DETAILED DESCRIPTION

Figure 1:
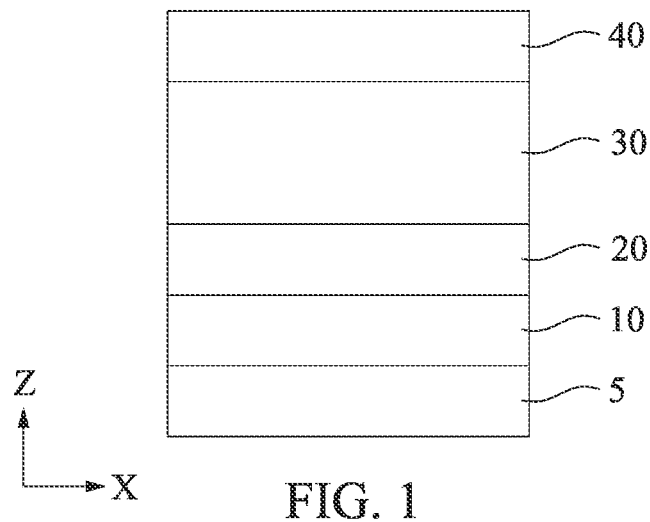

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a complementary metal-oxide-semiconductor field effect transistor (CMOS FET), for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure. In the present disclosure, a spacer film deposition combining an EUV or DUV lithography technology will be explained.

EUV lithography can form nano-meter order patterns smaller than, e.g., about 32 nm, but requires a very expensive EUV lithography apparatus. Accordingly, improving productivity (throughput e.g., the number of semiconductor wafers processed per hour) of an EUV lithography operation is one of the key issues to reduce a manufacturing cost of a semiconductor device. With decreasing critical dimension (CD) of features to be formed by the lithography operation, spaces between the features also decrease, which may cause a scum (residue of a photo resist) defect in the patterned photo resist. Moreover, when the thickness of the photo resist layer decreases to improve pattern resolution, etching resistivity against the underlying layer to be etched may become a problem.

In the present disclosure, a layer for a hard mask pattern is formed over the patterned photo resist layer which may contain one or more scum defects, and the underlying layer is etched by using the hard mask pattern as an etching mask. This technique can reduce pattern defects due to the resist scums and can improve etching selectivity against the underlying layer to be patterned.

FIGS. 1, 2A, 2B, 3, 4A, 4B, 5A, 5B, 6A, 6B, 7A, 7B, 8A and 8B show various stages of a sequential operation of a pattern formation method according to an embodiment of the present disclosure. It is understood that additional operations can be provided before, during, and after the operations of FIGS. 1-8B, and some of the operations described below can be replaced or eliminated, for additional embodiments of the method. The order of the operations/processes may be interchangeable.

As shown in FIG. 1, a target layer 20 to be etched or patterned is formed over a substrate 5. In some embodiments, one or more underlying layers 10 are disposed between the target layer 20 and the substrate 5. In some embodiments, a bottom antireflective coating (BARC) layer 30 is formed on the target layer 20, and a photo resist layer 40 is formed on the BARC layer 30. In some embodiments, the BARC layer 30 is formed of an organic material which suppresses undesirable reflection or scattering of lithography light.

In some embodiments, the substrate 5 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 5 may include an epitaxial layer (epi-layer), which may be strained for performance enhancement, and/or may include a silicon-on-insulator (SOI) structure. In one embodiment, a p-type silicon substrate is used.

The target layer 20 to be patterned is one or more layers of a conductive material and/or a dielectric material. In some embodiments, the target layer 20 includes a dielectric material, such as silicon oxide, silicon nitride, SiON, SiOC, SiOCN, SiCN, aluminum based dielectric material (aluminum oxide, aluminum nitride, aluminum oxynitride), hafnium oxide, titanium oxide, zirconium oxide, ferroelectric material, low-k material, organic material, or any other dielectric material used in a semiconductor device fabrication. In other embodiments, the target layer 20 is one or more conductive material layers, such as crystalline semiconductor, polysilicon, amorphous silicon, and metallic materials. The metallic materials include W, Cu, Ti, Ta, Ag, Al, AlCu, TiAl, TiN, TaN, TiAlN, TiAlC, TaC, TaCN, TaSiN, Mo, Mn, Co, Pd, Ni, Re, Ir, Ru, Pt, and/or Zr, or alloys thereof (e.g., silicide), or magnetic materials or any other conductive material used in a semiconductor device fabrication in some embodiments. The target layer 20 can be formed by physical vapor deposition (PVD), chemical vapor deposition (CVD), atomic layer deposition (ALD) and/or plating, although any acceptable process may be utilized.

In some embodiments, when the target layer 20 is formed of a conductive material, the underlying 10 is formed of one or more dielectric materials as set forth above. In some embodiments, the dielectric material covers electronic devices (e.g., transistors) formed over the substrate 5. In other embodiments, when the target layer 20 is formed of a dielectric material or a semiconductor material, as set forth above, it is used for a hard mask pattern to pattern the underlying layer 10 that is formed of one or more conductive materials, as set forth above.

In some embodiments, the thickness of the photo resist layer 40 is in a range from about 30 nm to about 100 nm, and is in a range from about 40 nm to 70 nm in other embodiments, depending on various process conditions and/or resist properties. In some embodiments, the photo resist layer 40 is spin-coated on the target layer 20. In some embodiments, the photo resist layer 40 is an EUV photo resist or a DUV photo resist. In some embodiments, the thickness of the BARC layer 30 is in a range from about 20 nm to about 100 nm, and is in a range from about 30 nm to 50 nm in other embodiments, depending on various process conditions and/or resist properties.

Figure 2A:
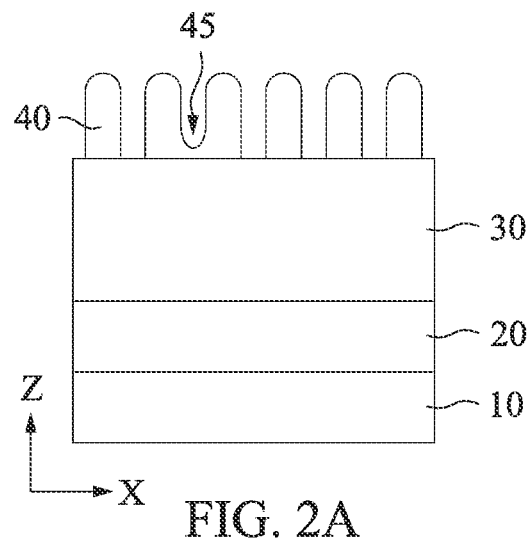
Figure 2B:
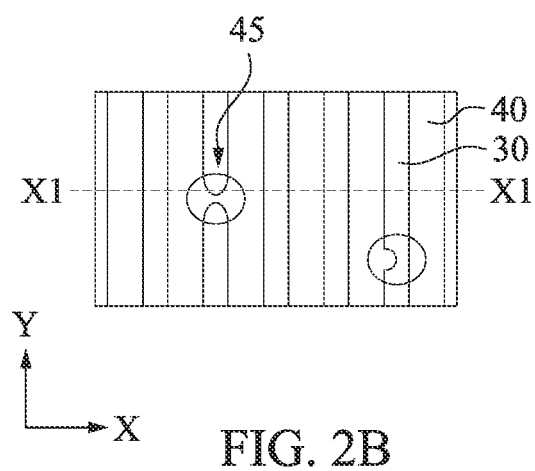

Then, as shown in FIGS. 2A and 2B, the photo resist layer 40 is exposed with an actinic radiation carrying pattern information of a circuit pattern formed on a photo mask. FIG. 2A is a cross sectional view corresponding to line X1-X1 of FIG. 2B and FIG. 2B is a plan view. In some embodiments, before the exposure to the actinic radiation, the photo resist layer 40 is subjected to a pre-baking process. In some embodiments, the actinic radiation is an EUV light (about 13.5 nm wavelength). In other embodiments, an electron beam, an ArF laser light or a KrF laser light are used as the actinic radiation. The photo mask is a reflective photo mask for an EUV light in some embodiments. In other embodiments the photo mask is a transmissive photo mask for an ArF laser light or a KrF laser light. When an electron beam is used, no photo mask is used in some embodiments. In some embodiments, the pitch of the line patterns of the photo resist pattern 40 is in a range from about 30 nm to about 100 nm and is in a range from about 40 nm to about 80 nm in other embodiments. The ratio of the space to line of the pattern is about 1 to about 4 in some embodiments.

After the exposure, the exposed photo resist layer 40 is subjected to a post exposure baking (PEB) process and then to a developing process, thereby forming a developed photo resist pattern, as shown in FIG. 2A and 2B. The developed photo resist pattern 40 includes line and space (opening) patterns extending in the Y direction in some embodiments. In other embodiments, the developed photo resist pattern 40 includes line and space (opening) patterns extending in the X direction.

In some embodiments, the photo resist pattern 40 includes one more resist scums 45 (residue of photo resist), as shown in FIGS. 2A and 2B. In some embodiments, the resist scum 45 connects two adjacent patterns. In other embodiments, the resist scum 45 is a lateral protrusion not reaching the adjacent pattern. In some embodiments, the height (thickness) of the resist scum is more than 0 nm and less than 25% of the height (thickness) of the photo resist pattern 40. In other embodiments, the thickness of the resist scum is equal to or more than 1% and equal to or less than 10% of the thickness of the photo resist pattern.

Figure 3:
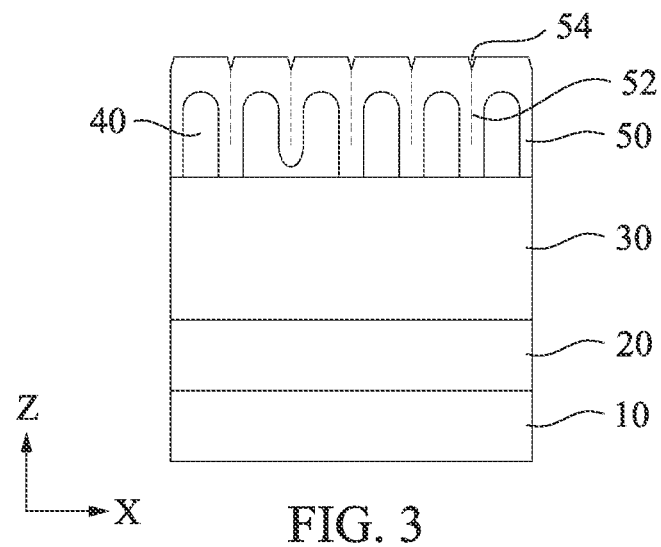

Then, as shown in FIG. 3, one or more layers 50 for a hard mask pattern are formed over the photo resist pattern 40 including scums 45 as sidewalls. The layer 50 is not a photo resist layer in some embodiments. As shown in FIG. 3, the layer 50 partially or fully fills the spaces between adjacent line patterns in some embodiments. When the layer 50 partially fills the spaces, a seam or a void 52 is formed between the sidewalls by the layer 50. In some embodiments, a notch or recess 54 is formed above the seam or void 52. When the layer 50 fully fills the spaces, adjacent sidewalls of the layer 50 merge. Even when the layer 50 fully fills the spaces of the adjacent line patterns, a notch or recess 54 is formed in some embodiments.

In some embodiments, the layer 50 for the hard mask pattern includes a dielectric material, such as silicon oxide, silicon nitride, SiON, SiOC, SiOCN, SiCN, aluminum based dielectric material (aluminum oxide, aluminum nitride, aluminum oxynitride), hafnium oxide, titanium oxide, zirconium oxide or any other suitable material. In other embodiments, amorphous or poly silicon, TiN, TaN, or other suitable conductive material is used as the layer 50. The material for the layer 50 has a higher etching selectivity (e.g., more than 10×) with respect to the BRAC layer 30 and/or the target layer 20. The layer 50 can be formed by chemical vapor deposition (CVD) and/or atomic layer deposition, although any acceptable process may be utilized. In some embodiments, a process temperature of the formation of the layer 50 is equal to or more than room temperature (25° C.) and less than about 250° C. In other embodiments, the process temperature is less than 150° C.

Figure 4A:
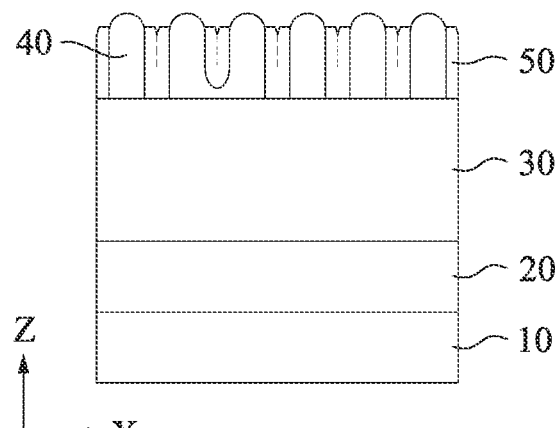
Figure 4B:
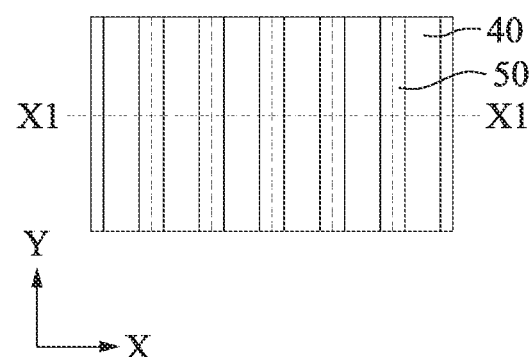

After the layer 50 for the hard mask is formed, one or more planarization operations are performed to expose the upper surface of the photo resist pattern 40, thereby forming a hard mask pattern 50, as shown in FIGS. 4A and 4B. FIG. 4A is a cross sectional view corresponding to line X1-X1 of FIG. 4B and FIG. 4B is a plan view. In some embodiments, a plasma etch-back operation is used as the planarization operation. In other embodiments, a chemical mechanical polishing (CMP) operation is performed. The scums 45 are embedded in the layer 50 and are not exposed by the planarization operation.

Figure 5A:
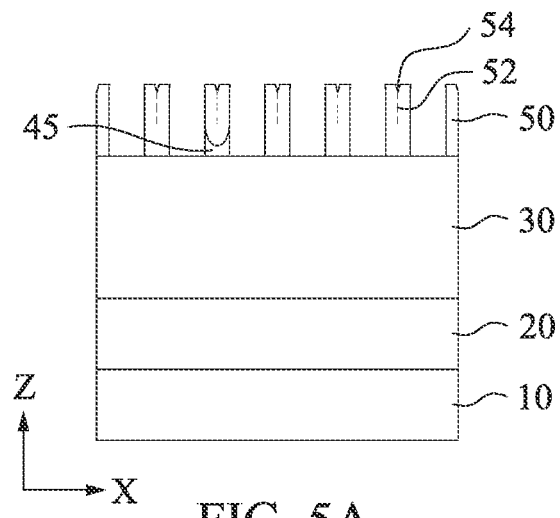
Figure 5B:
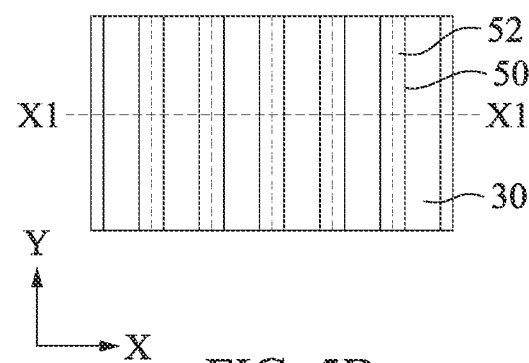

Then, as shown in FIGS, 5A and 5B, the resist pattern 40 is removed, thereby leaving a hard mask pattern of the layer 50. FIG. 5A is a cross sectional view corresponding to line X1-X1 of FIG. 5B and FIG. 5B is a plan view. In some embodiments, the resist pattern 40 is removed by anisotropic etching, such as anisotropic plasma dry etching. In other embodiments, isotropic etching, such as isotropic plasma dry etching or wet etching, is used. As shown in FIG. 5A, the resist scum remains under the hard mask pattern 50 in some embodiments, but is not observable from the top view as shown in FIG. 5B. In other words, the layer 50 conceals the scums.

Figure 6A:
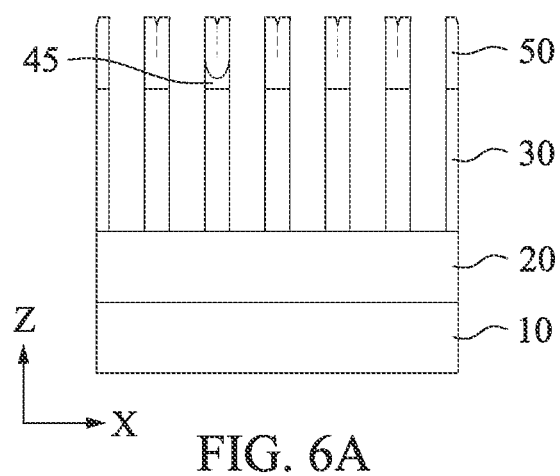
Figure 6B:
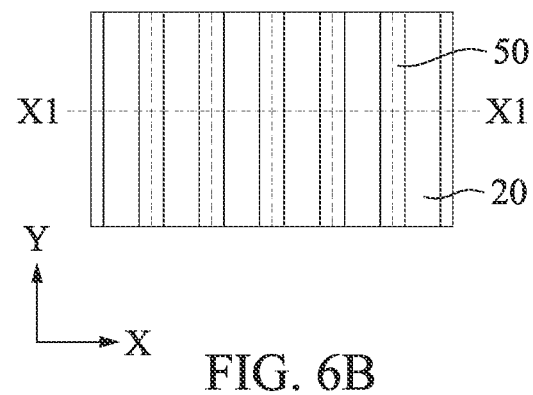

Further, as shown in FIGS. 6A and 6B, the BARC layer 30 is patterned by using the layer 50 as an etching mask. FIG. 6A is a cross sectional view corresponding to line X1-X1 of FIG. 6B and FIG. 6B is a plan view.

In other embodiments, the operations of FIGS. 5A-5B and 6A-6B are combined, and the photo resist layer 40 and the BARC layer 30 are etched by using the hard mask pattern 50 as an etching mask.

Subsequently, as shown in FIGS. 7A and 7B, the target layer 20 is patterned by using the hard mask pattern 50 as an etching mask, and then the hard mask layer 50 and the BARC layer 30 are removed, as shown in FIGS. 8A and 8B. FIGS. 7A and 8A are cross sectional views corresponding to line X1-X1 of FIGS. 7B and 8B, and FIGS. 7B and 8B are plan views. As shown in FIGS. 2A-2B and 8A-8B, the tone of the photo resist pattern 40 is reversed by the hard mask layer 50.

FIGS. 9A, 9B, 10A, 10B, 11A, 11B, 12A and 12B show various stages of a sequential operation of a pattern formation method according to an embodiment of the present disclosure. It is understood that additional operations can be provided before, during, and after the operations of FIGS. 9A-12B, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1-8B may be employed in the following embodiments, and some of the explanations may be omitted.

In the foregoing embodiments, the photo resist pattern 40 includes line-and-space patterns, but the configuration of the photo resist pattern 40 is not limited to an alternating pattern of lines and spaces. In some embodiments, the photo resist pattern 40 includes a plurality of island patterns as shown in FIGS. 9A and 9B. FIGS. 9A and 9B show the structure after the photo resist pattern 40 is formed similar to FIGS. 2A and 2B, and FIG. 9A is a cross sectional view corresponding to line X2-X2 of FIG. 9B and FIG. 9B is a plan view. In some embodiments, an aspect ratio of length to width of the island pattern is in a range from about 1 to 10. In some embodiments, as shown in FIGS. 9A and 9B, one or more resist scums 45 are formed between adjacent patterns.

Then, similar to FIGS. 3 and 4A-4B, a layer 50 for a hard mask pattern 50 is formed over the photo resist pattern 40 and one or more planarization operations are performed to expose the upper surface of the photo resist pattern 40, as shown in FIGS. 10A and 10B. FIG. 10A is a cross sectional view corresponding to line X2-X2 of FIG. 10B and FIG. 10B is a plan view.

Then, as shown in FIGS. 11A and 11B, the photo resist layer 40 and the BARC layer 30 are etched by using the hard mask pattern 50 as an etching mask, thereby leaving a hard mask pattern 50, similar to FIGS. 7A-8B. FIG. 11A is a cross sectional view corresponding to line X2-X2 of FIG. 11B, and FIG. 11B is a plan view. As shown in FIG. 11A, the resist scum 45 remains under the hard mask pattern 50 in some embodiments, but is not observable from the top view as shown in FIG. 11B. Subsequently, as shown in FIGS. 12A and 12B, the target layer 20 is patterned by using the hard mask pattern 50 as an etching mask, and then the hard mask layer 50 and the BARC layer 30 are removed, similar to FIGS. 8A and 8B. FIG. 12A is a cross sectional view corresponding to line X2-X2 of FIG. 12B, and FIG. 12B is a plan view. A plurality of opening patterns (e.g., recesses or holes) are formed in the target layer 20, and the tone of the photo resist pattern 40 is reversed by the hard mask layer 50, and as shown in FIGS. 9A and 9B and 12A and 12B.

FIGS. 13A, 13B, 14A, 14B, 15A, 15B, 16A and 16B show various stages of a sequential operation of a pattern formation method according to an embodiment of the present disclosure. It is understood that additional operations can be provided before, during, and after the operations of FIGS. 13A-16B, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1-12B may be employed in the following embodiments, and some of the explanations may be omitted.

Figure 13A:
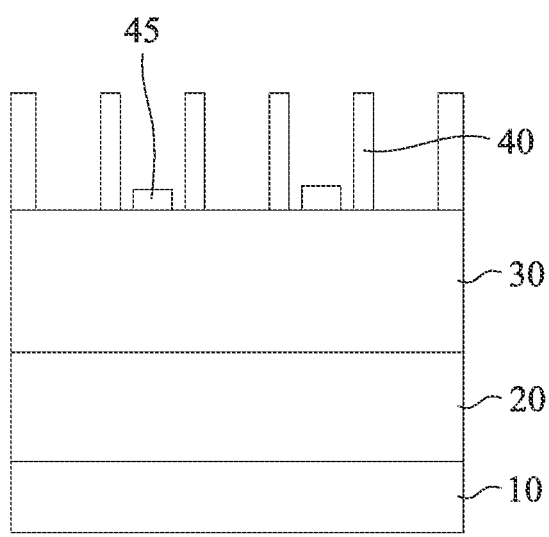
FIGS. 13A, 13B, 14A, 14B, 15A, 15B, 16A and 16B show various stages of a sequential operation of a pattern formation method according to an embodiment of the present disclosure.
Figure 13B:
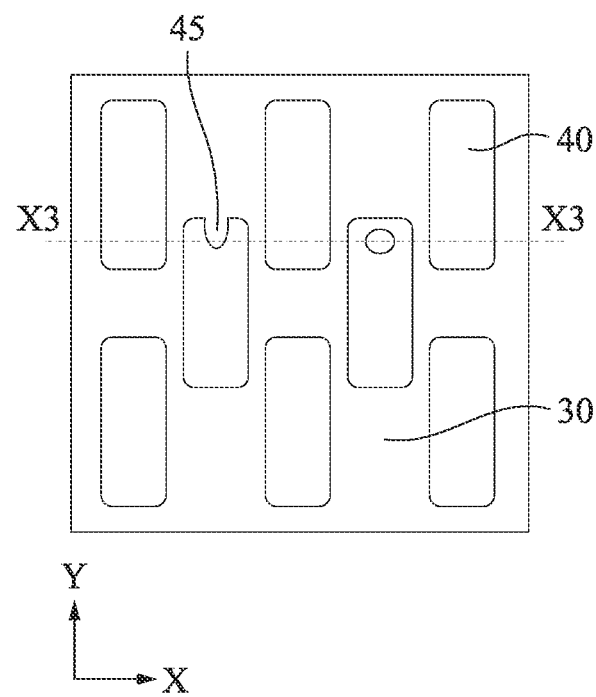

In some embodiments, the photo resist pattern 40 includes a plurality of openings (holes) as shown in FIGS. 13A and 13B. FIGS. 13A and 13B show the structure after the photo resist pattern 40 is formed similar to FIGS. 2A and 2B, and FIG. 13A is a cross sectional view corresponding to line X3-X3 of FIG. 13B and FIG. 13B is a plan view. In some embodiments, an aspect ratio of length to width of the opening is in a range from about 1 to 10. In some embodiments, as shown in FIGS. 13A and 13B, one or more resist scums 45 are formed in the openings.

Figure 14A:
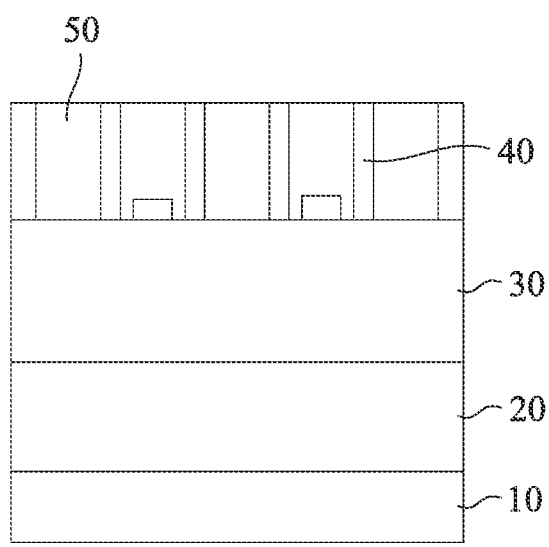
Figure 14B:
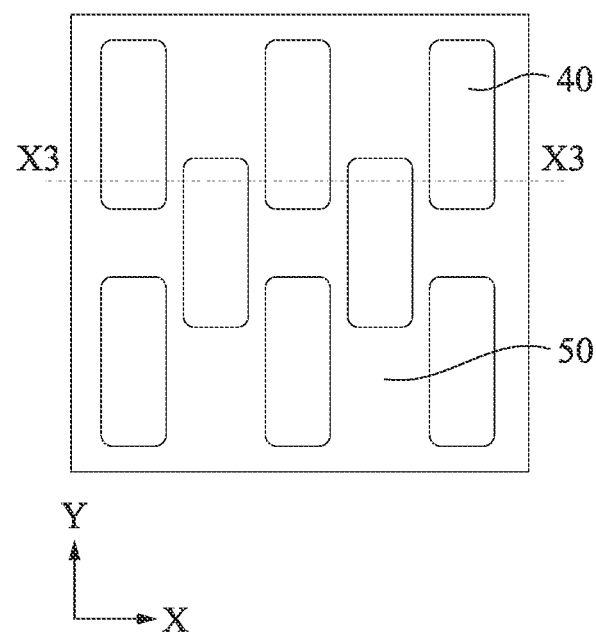

Then, similar to FIGS. 3 and 4A-4B, a layer 50 for a hard mask pattern 50 is formed over the photo resist pattern 40 and one or more planarization operations are performed to expose the upper surface of the photo resist pattern 40, as shown in FIGS. 14A and 14B. FIG. 14A is a cross sectional view corresponding to line X3-X3 of FIG. 14B and FIG. 14B is a plan view.

Figure 15A:
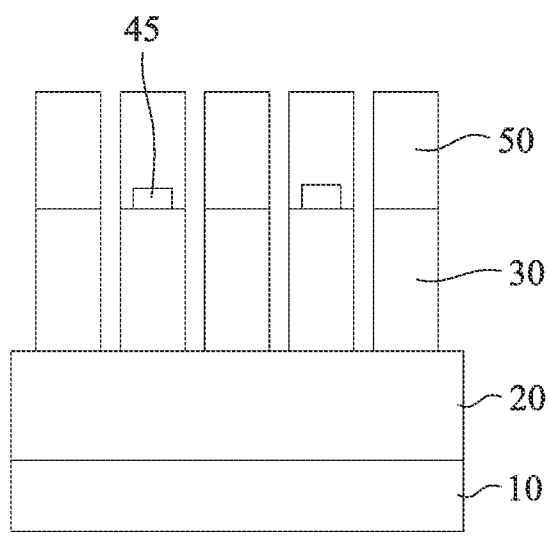
Figure 15A:
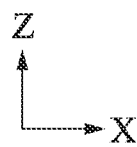
Figure 15B:
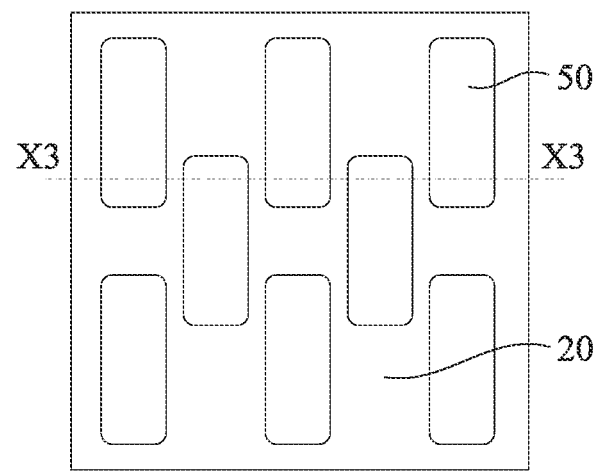
Figure 15B:
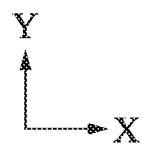

Then, as shown in FIGS. 15A and 15B, the photo resist layer 40 and the BARC layer 30 are etched by using the hard mask pattern 50 as an etching mask, thereby leaving a hard mask pattern 50, similar to FIGS. 7A-8B. FIG. 15A is a cross sectional view corresponding to line X3-X3 of FIG. 15B, and FIG. 15B is a plan view. As shown in FIG. 15A, the resist scum 45 remains under the hard mask pattern 50 in some embodiments, and is not observable from the top view as shown in FIG. 15B.

Figure 16A:
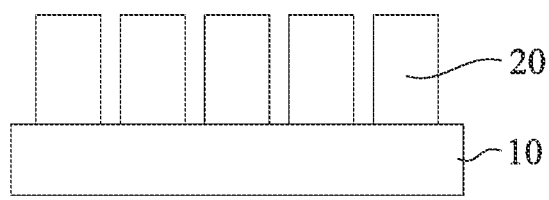
Figure 16A:
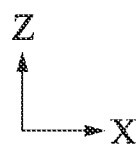
Figure 16B:
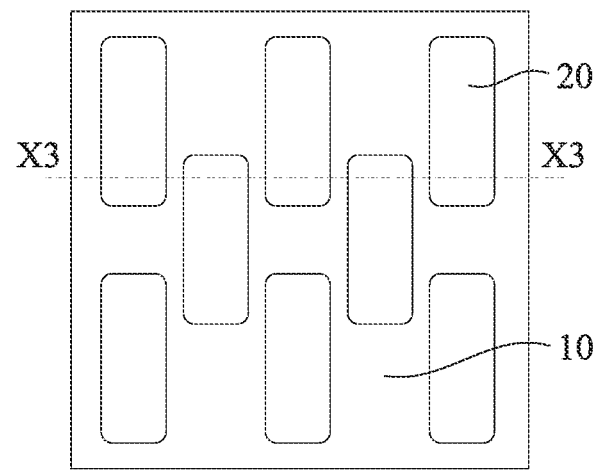
Figure 16B:
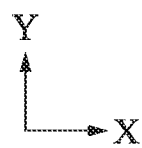

Subsequently, as shown in FIGS. 16A and 16B, the target layer 20 is patterned by using the hard mask pattern 50 as an etching mask, and then the hard mask layer 50 and the BARC layer 30 are removed, similar to FIGS. 8A and 8B. FIG. 16A is a cross sectional view corresponding to line X3-X3 of FIG. 16B, and FIG. 16B is a plan view. The tone of the photo resist pattern 40 is reversed by the hard mask layer 50, and as shown in FIGS. 16A and 16B, a plurality of island patterns are formed in the target layer 20.

Figure 17A:
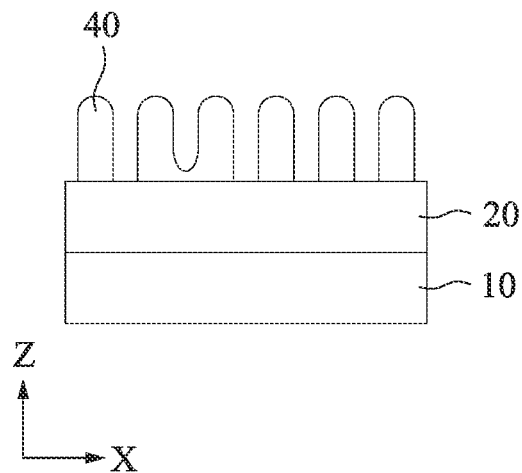
FIGS. 17A and 17B show various stages of a sequential operation of a pattern formation method according to an embodiment of the present disclosure.
Figure 17B:
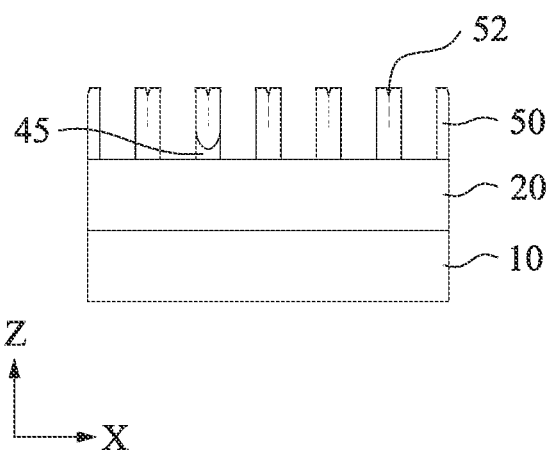

FIGS. 17A and 17B show various stages of a sequential operation of a pattern formation method according to an embodiment of the present disclosure. It is understood that additional operations can be provided before, during, and after the operations of FIGS. 17A and 17B, and some of the operations described below can be replaced or eliminated, for additional embodiments of the method. The order of the operations/processes may be interchangeable. Materials, configurations, dimensions, structures, conditions, and operations the same as or similar to those explained with respect to FIGS. 1-16B may be employed in the following embodiments, and some of the explanations may be omitted.

In some embodiments, a BRAC layer 30 is not used and the photo resist pattern 40 is directly formed on the target layer 20 as shown in FIG. 17A. Then, the hard mask pattern including one or more resist scums 45 is formed on the target layer. A hard mask pattern 50 is formed as shown in FIG. 17B, and subsequently, the target layer 20 is patterned by using the hard mask pattern 50 as an etching mask.

Figure 18A:
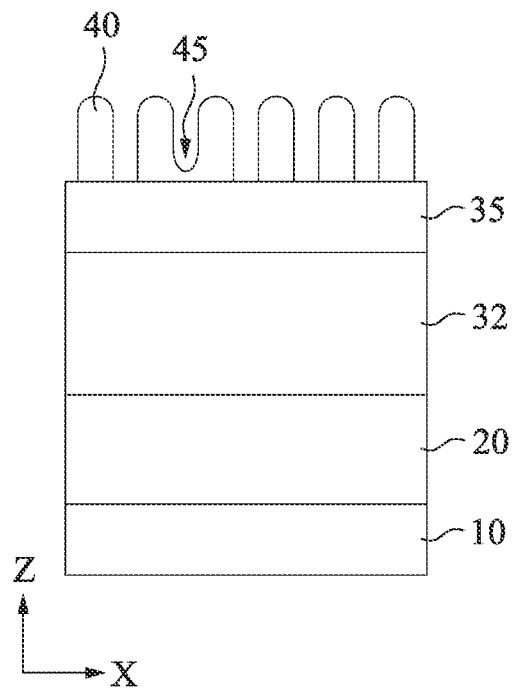
FIGS. 18A and 18B show various stages of a sequential operation of a pattern formation method according to an embodiment of the present disclosure.
Figure 18B:
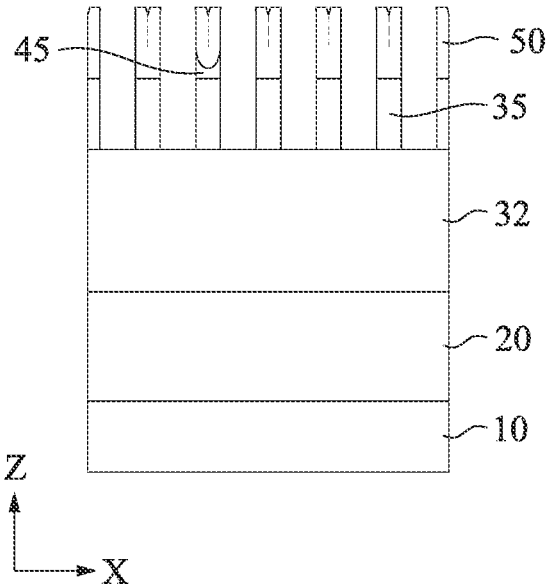

FIGS. 18A and 18B show various stages of a sequential operation of a pattern formation method according to an embodiment of the present disclosure. It is understood that additional operations can be provided before, during, and after the operations of FIGS. 18A and 18B, and some of the operations described below can be replaced or eliminated, for additional embodiments of the method. The order of the operations/processes may be interchangeable. Materials, configurations, dimensions, structures, conditions, and operations the same as or similar to those explained with respect to FIGS. 1-16B may be employed in the following embodiments, and some of the explanations may be omitted.

In some embodiments, a tri-layer resist system is used. As shown in FIG. 18A, a bottom layer 32 is formed over the target layer 20. In some embodiments, the bottom layer 30 is made of an organic material. The organic material may include a plurality of monomers or polymers that are not cross-linked. In some embodiments, the bottom layer 32 contains a material that is patternable and/or has a composition tuned to provide anti-reflection properties. Exemplary materials for the bottom layer 32 include a BARC material, carbon backbone polymers, such as polyhydroxystyrene (PHS), poly methyl methacrylate (PMMA), polyether, and combinations thereof, and other organic polymers containing aromatic rings. The bottom layer 32 is used to planarize the structure, as the underlying structure may be uneven. In some embodiments, the bottom layer 32 is formed by a spin coating process. In other embodiments, the bottom layer 32 is formed by another suitable deposition process. The thickness of the bottom layer 32 is in a range from about 30 nm to about 200 nm in some embodiments and is in a range from about 50 nm to about 100 nm in other embodiments.

Further, as shown in FIG. 18A, a middle layer 35 is formed over the bottom layer 32. In some embodiments, the middle layer 35 is formed by spin-coating a silicon containing solution over the bottom layer, and the coated layer is baked at 80-120° C. for 30 sec to 120 sec. In some embodiments, the baking of the coated layer is performed on a baking plate. The thickness of the middle layer 35 is in a range from about 20 nm to about 100 nm in some embodiments, and is in a range from about 30 nm to about 80 nm in other embodiments. In some embodiments, the middle layer 35 is a silicon containing layer including silicon and organic material. As shown in FIG. 18A, a photo resist pattern 40 including a resist scum 45 is formed on the middle layer 35. A hard mask pattern 50 is formed as shown in FIG. 18B, and subsequently, the middle layer 35 is patterned by using the hard mask pattern 50 as an etching mask. Further, the bottom layer 32 is patterned, and then the target layer 20 is patterned. In some embodiments, the target layer 20 is patterned by using the patterned bottom layer 32 as an etching mask, and in other embodiments, the target layer 20 is patterned by using the patterned middle layer and bottom layer 32 as an etching mask. In certain embodiments, the target layer 20 is patterned by using the hard mask pattern 50 and the patterned middle and bottom layers as an etching mask.

Figure 19:
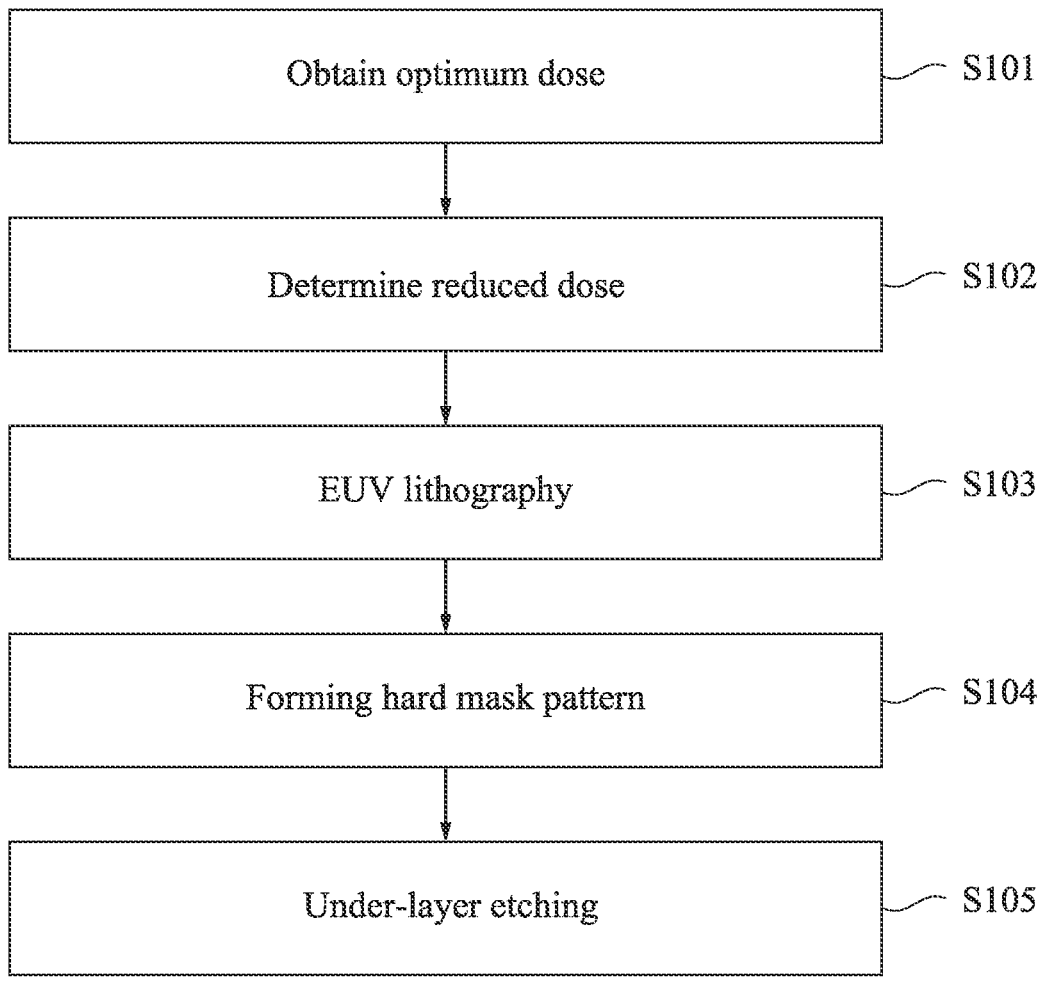
FIG. 19 illustrates a flow chart of a sequential operation of a pattern formation method according to an embodiment of the present disclosure.

FIG. 19 illustrates a flow chart of a sequential operation of a pattern formation method according to an embodiment of the present disclosure. It is understood that additional operations can be provided before, during, and after the operations of FIG. 19, and some of the operations described below can be replaced or eliminated, for additional embodiments of the method. The order of the operations/processes may be interchangeable. Materials, configurations, dimensions, structures, conditions, and operations the same as or similar to those explained with respect to FIGS. 1-18B may be employed in the following embodiments, and some of the explanations may be omitted.

As set for above, one of the issues to be resolved in an EUV (or DUV) lithography is a low throughput. Reducing an exposure dose may improve the throughput of the EUV lithography operation. However, resist scums are more likely formed when the exposure dose of photo lithography is relatively low, for example, lower than an optimum dose. In the following embodiment, a dose amount of the EUV exposure is reduced from the optimum dose amount which may cause resist scums, and the hard mask pattern 50 as set forth above is employed to suppress defects which would otherwise be caused by the resist scums.

At S101 of FIG. 19, an optimum dose is obtained using a photo mask. The optimum dose is determined to obtain a desired pattern (e.g., a minimum pattern in the photo mask) over the underlying layer (e.g., the BARC layer 30) in some embodiments. In some embodiments, a standard EUV photo resist is used. In some embodiments, the standard EUV photo resist requires a standard optimum dose amount in a range from about 55 mJ/cm$^2$ to 100 mJ/cm$^2$. In other embodiments, a high sensitivity EUV photo resist requiring a lower optimum dose amount in a range from 30 mJ/cm$^2$ to 45 mJ/cm$^2$ is used. Then, at S102 of FIG. 19, a reduced dose amount less than the optimum dose amount is determined. In some embodiments, the reduced dose amount is about 60% to 99% of the optimum dose amount. In other embodiments, the reduced dose amount is about 80% to 90% of the optimum dose amount.

At S103 of FIG. 19, the photo resist layer is exposed with the reduced dose amount less than the optimum dose amount. In some embodiments, a temperature and/or a process time of the PEB process are increased. In some embodiments, the temperature of the PEB process is about 10° C. to 20° C. higher than the PEB process temperature for the optimum dose amount. In some embodiments, the process time of the PEB process is about 30 sec to about 60 sec longer than the PEB process time for the optimum dose amount. In other embodiments, a developing time by a developing solution is extended by, for example, about 30 sec to 60 sec longer than the developing process time for the optimum dose amount. Since the exposure dose amount is set lower than the optimum dose amount, one or more resist scums are generated in the photo resist pattern.

Then at S104 of FIG. 19, similar to the operations explained with respect to FIGS. 3-5, the hard mask pattern 50 concealing the resist scums are formed, and then at S105 of FIG. 19, the underlying layer is patterned by using the hard mask pattern 50 as an etching mask.

In some embodiments, test patterns are formed over the underlying layer with the photo mask by varying the exposure dose amount. By measuring the developed pattern, a dose amount that is smaller than the optimum dose amount and that can form acceptable resist patterns is determined as the reduced dose amount.

Figure 20:
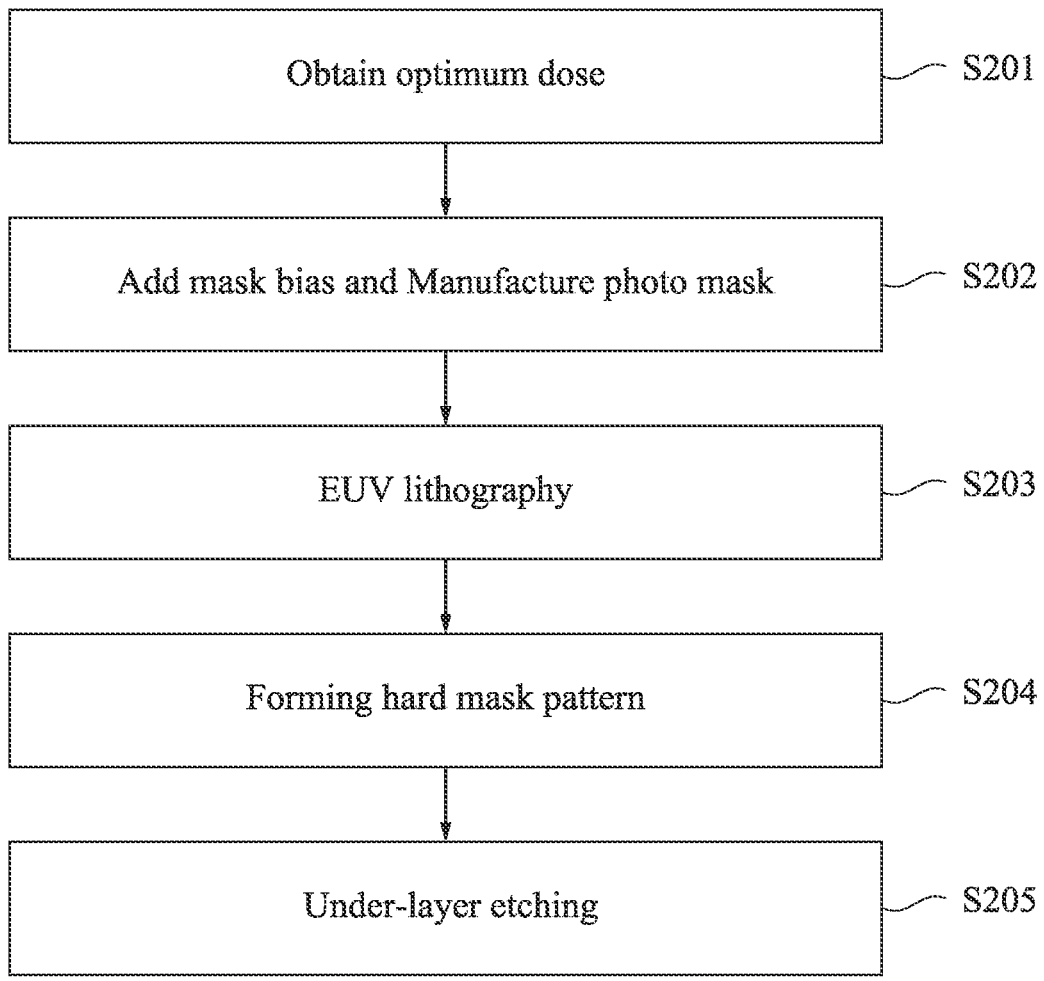
FIG. 20 illustrates a flow chart of a sequential operation of a pattern formation method according to an embodiment of the present disclosure.

FIG. 20 illustrates a flow chart of a sequential operation of a pattern formation method according to an embodiment of the present disclosure. It is understood that additional operations can be provided before, during, and after the operations of FIG. 20, and some of the operations described below can be replaced or eliminated, for additional embodiments of the method. The order of the operations/processes may be interchangeable. Materials, configurations, dimensions, structures, conditions, and operations the same as or similar to those explained with respect to FIGS. 1-19 may be employed in the following embodiments, and some of the explanations may be omitted.

FIG. 20 illustrates a flow chart of a sequential operation of a pattern formation method according to another embodiment of the present disclosure. It is understood that additional operations can be provided before, during, and after the operations of FIG. 20, and some of the operations described below can be replaced or eliminated, for additional embodiments of the method. The order of the operations/processes may be interchangeable. Materials, configurations, dimensions, structures, conditions, and operations the same as or similar to those explained with respect to FIGS. 1A-6 may be employed in the following embodiments, and some of the explanations may be omitted.

In this embodiments, a mask bias is added during manufacturing a photo mask to reduce a required dose amount. The mask bias is broadening an opaque pattern or narrowing an opaque pattern on the photo mask. In an EUV reflective photo mask, an opaque pattern is a non-reflective pattern. When an EUV photo resist is a positive photo resist system (exposed portion dissolved by a developing solution), reducing an opaque pattern size (e.g., width) reduces a required dose to obtain a desired pattern in some embodiments. In contrast, in other embodiments, when an EUV photo resist is a negative photo resist system (not-exposed portion dissolved by a developing solution), increasing an opaque pattern size reduces a required dose to obtain a desired pattern.

At S201 of FIG. 20, an optimum dose is obtained using a test photo mask without a mask bias in some embodiments. The optimum dose is determined to obtain a desired pattern (e.g., a minimum pattern in the test photo mask) over the underlying layer in some embodiments.

Then, at S202 of FIG. 20, a mask bias that can reduce the dose amount (a required dose) from the optimum dose amount is determined, and a photo mask with a circuit pattern is manufactured with the mask bias using EUV lithography at S203 of FIG. 20.

At S203 of FIG. 20, the photo resist layer is exposed with the reduced dose amount smaller than the optimum dose amount. In some embodiments, at S203, a temperature and/or a process time of the PEB process are changed. In some embodiments, the temperature of the PEB process is about 10° C. to 20° C. higher than the PEB process temperature for determining the optimum dose amount without a mask bias. In some embodiments, the process time of the PEB process is about 30 sec to about 60 sec longer than the PEB process time for the optimum dose amount without a mask bias. In other embodiments, a developing time by a developing solution is extended by, for example, about 30 sec to 60 sec longer than the developing process time for the optimum dose amount without a mask bias.

In some embodiments, the test photo mask includes patterns with different mask biases. Test patterns are formed over the underlying layer with the test mask by varying the exposure dose amount. By measuring the developed pattern, the combination of the mask bias and a dose amount that is smaller than the optimum dose amount is determined. In some embodiments, two or more combinations can be determined. In some embodiments, test patterns are formed over the underlying layer with the photo mask by varying the exposure dose amount. By measuring the developed pattern, a dose amount that is smaller than the optimum dose amount and that can form acceptable resist patterns is determined as the reduced dose amount.

Then at S204 of FIG. 20, similar to the operations explained with respect to FIGS. 3-5, the hard mask pattern 50 concealing the resist scums are formed, and then at S205 of FIG. 19, the underlying layer is patterned by etching using the hard mask pattern 50 as an etching mask.

FIGS. 21A, 21B, 21C, 21D, 21E and 21F show various stages of a sequential operation of a pattern formation method according to an embodiment of the present disclosure. It is understood that additional operations can be provided before, during, and after the operations of FIGS. 21A-21F, and some of the operations described below can be replaced or eliminated, for additional embodiments of the method. The order of the operations/processes may be interchangeable. Materials, configurations, dimensions, structures, conditions, and operations the same as or similar to those explained with respect to FIGS. 1-19 may be employed in the following embodiments, and some of the explanations may be omitted.

One method to improve resolution of an EUV lithography is to decrease the thickness of the photo resist layer. However, when the thickness of the photo resist layer decreases to improve pattern resolution, etching resistivity against the underlying layer to be etched may become a problem.

Figure 21A:
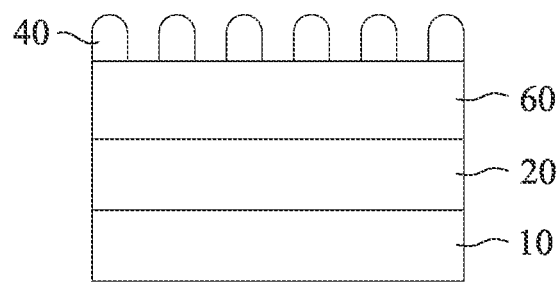
FIGS. 21A, 21B, 21C, 21D, 21E and 21F show various stages of a sequential operation of a pattern formation method according to an embodiment of the present disclosure.

In FIG. 21A, a hard mask layer 60 is formed over the target layer 20 to be patterned, and a photo resist pattern 40 is formed on the hard mask layer 60. In some embodiments, the hard mask layer 60 includes a dielectric material, such as silicon oxide, silicon nitride, SiON, SiOC, SiOCN, SiCN, aluminum based dielectric material (aluminum oxide, aluminum nitride, aluminum oxynitride), hafnium oxide, titanium oxide, zirconium oxide or any other suitable material. In other embodiments, amorphous or polycrystalline silicon, TiN, TaN, or other suitable conductive material is used as the hard mask layer 60. The material for the hard mask layer 60 has a higher etching selectivity (e.g., more than 10×) with respect to the target layer 20. The hard mask layer 60 can be formed by chemical vapor deposition (CVD) and/or atomic layer deposition, although any acceptable process may be utilized. In some embodiments, the thickness of the photo resist pattern 40 is in a range from about 10 nm to about 50 nm.

Figure 21B:
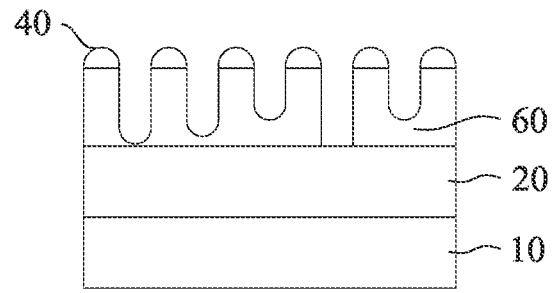

In FIG. 21B, the hard mask layer 60 is patterned by using the photo resist pattern 40 as an etching mask. Since the thickness of the photo resist pattern 40 is small, the etching of the hard mask layer 60 is stopped not to fully expose the upper surface of the target layer 20. In some embodiments, the upper surface of the target layer 20 is partially exposed at the etched portion of the hard mask layer 60, and in other embodiments the upper surface of the target layer 20 is not exposed. In some embodiments, the depth of the etched portion of the hard mask layer 60 is about 25% to less than 100% of the thickness of the hard mask layer 60. In other words, the thickness of the remaining portion is more than 0% and equal to less than 25% of the thickness of the hard mask layer 60. In other embodiments, the thickness of the remaining portion is equal to or more than 1% and equal to less than 10% of the thickness of the hard mask layer 60.

Figure 21C:
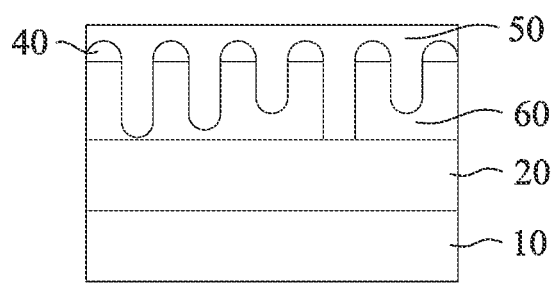

Then, a layer 50 for a hard mask pattern is formed as shown in FIG. 21C. The material for the layer 50 is selected from the aforementioned materials, and is different from the hard mask layer 60. In some embodiments, the material for the layer 50 has a higher etching selectivity (e.g., more than 10×) with respect to the target layer 20 and the hard mask layer 60.

Figure 21D:
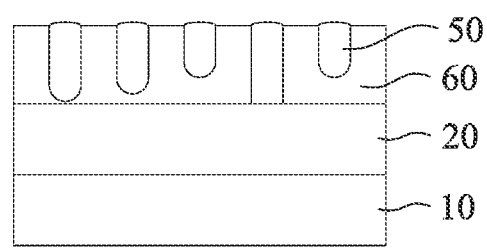

Next, as shown in FIG. 21D, a planarization operation, such as an etch-back operation or a CMP operation, is performed to expose the upper surface of the hard mask layer 60, thereby forming a hard mask pattern 50.

Figure 21E:
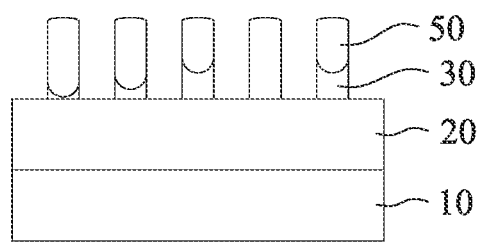
Figure 21F:
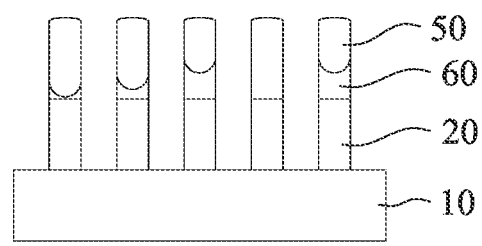

Then, by using the hard mask pattern 50 as an etching mask, the hard mask layer 60 is patterned, as shown in FIG. 21E, and then the target layer 21F is patterned, as shown in FIG. 21F.

Although a directional etching operation subsequent to an EUV patterning operation is mainly explained in the foregoing embodiments, other lithography operations, such as DUV lithography using ArF or KrF laser light or an electron beam lithography, can be employed.

As set forth above, by using a hard mask layer 50 over the patterns with one or more un-patterned residuals (e.g., resist scums), to conceal the residuals, it is possible to obtain fine patterns without defects which would be otherwise caused by the residuals. It is also possible to form fine patterns even though a low dose lithography operation is performed, thus it is possible to improve the throughput of a lithography operation.

It will be understood that not all advantages have been necessarily discussed herein, no particular advantage is required for all embodiments or examples, and other embodiments or examples may offer different advantages.

In accordance with an aspect of the present disclosure, in a method of forming a pattern, a first pattern is formed over an underlying layer, the first pattern including main patterns and a lateral protrusion having a thickness of less than 25% of a thickness of the main patterns, a hard mask layer is formed over the first pattern, a planarization operation is performed to expose the first pattern without exposing the lateral protrusion, a hard mask pattern is formed by removing the first pattern while the lateral protrusion being covered by the hard mask layer, and the underlying layer is patterned using the hard mask pattern as an etching mask. In one or more of the foregoing and following embodiments, the first pattern is a photo resist pattern and the lateral protrusion is a resist scum. In one or more of the foregoing and following embodiments, the photo resist pattern includes a plurality of line patterns extending in a first direction and arranged parallel to each other in a second direction crossing the first direction, and the hard mask pattern includes a plurality of line patterns extending the first direction and disposed at positions where a plurality of spaces of the photo resist pattern are located. In one or more of the foregoing and following embodiments, the underlying layer is made of a conductive material and the hard mask pattern is made of a dielectric material. In one or more of the foregoing and following embodiments, the underlying layer is made of a dielectric material and the hard mask pattern is made of a dielectric material different from the underlying layer. In one or more of the foregoing and following embodiments, the underlying layer includes an organic material. In one or more of the foregoing and following embodiments, the hard mask pattern includes one or more of silicon nitride, hafnium oxide, aluminum oxide, titanium oxide or titanium nitride. In one or more of the foregoing and following embodiments, the hard mask layer is formed by an atomic layer deposition.

In accordance with another aspect of the present disclosure, in a method of forming a pattern, a target layer to be patterned is formed over a substrate, a bottom antireflective coating (BARC) layer is formed over the target layer, a photo resist pattern is formed over the BARC layer, the photo resist pattern including a resist scum, a hard mask layer is formed over the photo resist pattern, a planarization operation is performed to expose the photo resist pattern without exposing the resist scum, a hard mask pattern is formed by removing the photo resist pattern while the resist scum being covered by the hard mask layer, the BARC layer is patterned using the hard mask pattern as an etching mask, and the target layer is patterned by using the patterned BARC layer and the hard mask pattern as an etching mask. In one or more of the foregoing and following embodiments, the photo resist pattern is formed by an extreme ultra violet (EUV) lithography. In one or more of the foregoing and following embodiments, the target layer is a metal layer. In one or more of the foregoing and following embodiments, the hard mask pattern includes one or more of silicon oxide, silicon nitride, SiON, SiOC, SiOCN, SiCN, aluminum oxide, aluminum nitride, aluminum oxynitride, hafnium oxide, titanium oxide or zirconium oxide. In one or more of the foregoing and following embodiments, the resist pattern is removed by anisotropic etching. In one or more of the foregoing and following embodiments, a seam or a void is formed in the hard mask layer between adjacent patterns of the photo resist pattern. In one or more of the foregoing and following embodiments, after the hard mask pattern is formed, the scum is not observed when viewed from above. In one or more of the foregoing and following embodiments, the hard mask layer is formed at a temperature equal to or less than 150° C.

In accordance with another aspect of the present disclosure, in a method of manufacturing a semiconductor device, a photo resist layer is formed over an underlying layer disposed over a semiconductor substrate, an optimum dose amount of an actinic radiation carrying pattern information from a photo mask with respect to the photo resist layer and a mask pattern of the photo mask is determined, an exposure dose amount smaller than the optimum dose is determined, the photo resist layer is exposed to the actinic radiation carrying pattern information with the determined exposure dose amount, the exposed photo resist layer is developed to form a developed resist pattern, a hard mask layer is formed over the developed resist pattern, a planarization operation is performed to expose the developed resist pattern, a hard mask pattern is formed by removing the developed resist pattern, and the underlying layer is patterned by using the hard mask pattern as an etching mask. In one or more of the foregoing and following embodiments, the developed resist pattern includes a resist scum and the hard mask pattern covers the resist scum. In one or more of the foregoing and following embodiments, the actinic radiation is an extreme ultra violet (EUV) light. In one or more of the foregoing and following embodiments, the exposure dose amount is 10% to 40% smaller than the optimum dose. In one or more of the foregoing and following embodiments, a dose amount of the EUV light is in a range from 30 mJ/cm$^2$ to 45 mJ/cm$^2$. In one or more of the foregoing and following embodiments, the developed resist pattern includes a plurality of line patterns extending in a first direction and arranged parallel to each other in a second direction crossing the first direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a first hard mask layer over a target layer to be patterned;
    forming a photo resist layer over the first hard mask layer;
    patterning the photo resist layer;
    etching the first hard mask layer using the patterned photo resist layer as an etching mask to form first etched portions of the first hard mask layer;
    forming a second hard mask layer over the patterned photo resist layer and the first hard mask layer, wherein the second hard mask layer fills the first etched portions of the first hard mask layer;
    planarizing the second hard mask layer to expose an upper surface of the first hard mask layer and form a second hard mask layer pattern; and
    etching exposed portions of the first hard mask layer and the target layer using the second hard mask layer pattern as an etching mask.

2. The method according to claim 1, wherein the first hard mask layer and the second hard mask layer are made of different materials.

3. The method according to claim 2, wherein the first hard mask layer and the second hard mask layer include a dielectric material.

4. The method according to claim 3, wherein the first hard mask layer and the second hard mask layer include silicon oxide, silicon nitride, SiOC, SiOCN, SiCN, aluminum oxide, aluminum nitride, aluminum oxynitride, hafnium oxide, titanium oxide, or zirconium oxide.

5. The method according to claim 2, wherein the first hard mask layer and the second hard mask layer include amorphous silicon, polycrystalline silicon, TiN, or TaN.

6. The method according to claim 2, wherein the second hard mask layer has a higher etching selectivity with respect to the first hard mask layer.

7. The method according to claim 1, wherein the first hard mask layer has a higher etching selectivity with respect to the target layer.

8. The method according to claim 1, wherein a depth of the first etched portions of the first hard mask layer ranges from 25% to less than 100% of a thickness of the first hard mask layer.

9. A method of manufacturing a semiconductor device, comprising:
    patterning a photo resist layer to form photo resist pattern over an underlying layer,
    wherein the photo resist pattern includes resist scum between adjacent photo resist pattern features;
    forming a hard mask layer over the photo resist pattern,
    wherein the hard mask layer includes a seam or void extending along a first direction between the adjacent photo resist pattern features of the photo resist pattern and a recess located at an end of the seam or void along the first direction,
    wherein the recess is located at a greater distance from the underlying layer along the first direction than an uppermost surface of the photo resist pattern;
    exposing an upper portion of the photo resist pattern;
    forming a hard mask pattern by etching exposed portions of the photo resist pattern using the hard mask pattern as an etching mask; and
    patterning the underlying layer using the hard mask pattern as an etching mask.

10. The method according to claim 9, wherein the hard mask layer is made of a dielectric material selected from the group consisting of silicon nitride, SiON, SiOC, SiOCN, SiCN, aluminum oxide, aluminum nitride, aluminum oxynitride, hafnium oxide and zirconium oxide.

11. The method according to claim 9, wherein the photo resist pattern includes a plurality of line patterns extending in a first direction and arranged parallel to each other in a second direction crossing the first direction.

12. The method according to claim 11, wherein the hard mask pattern includes a plurality of line patterns extending in the first direction and disposed at positions where a plurality of spaces of the photo resist pattern are located.

13. The method of claim 9, wherein the underlying layer is made of a conductive material and the hard mask pattern is made of a dielectric material.

14. The method of claim 9, wherein the underlying layer is made of a dielectric material and the hard mask pattern is made of a dielectric material different from the underlying layer.

15. The method of claim 9, wherein the underlying layer includes an organic material.

16. A method of manufacturing a semiconductor device, comprising:
    forming a photo resist layer over an underlying layer disposed over a semiconductor substrate;
    determining an optimum dose amount of actinic radiation to form a pattern in the photo resist layer exposing the underlying layer;
    selectively exposing the photo resist layer to an exposure dose amount of actinic less than the optimum dose amount,
    wherein the exposure dose amount is 10% to 40% less than the optimum dose amount;
    developing the exposed photo resist layer to form a photo resist pattern;
    forming a hard mask layer over the photo resist pattern;
    removing a portion of the hard mask layer to expose an upper portion of the photo resist pattern;

forming a hard mask pattern by removing the photo resist pattern; and etching the underlying layer by using the hard mask pattern as an etching mask.

17. The method of claim 16, wherein the photo resist pattern includes resist scum between adjacent photo resist pattern features.

18. The method of claim 17, wherein the hard mask pattern covers the resist scum.

19. The method of claim 17, wherein a seam or a void is formed in the hard mask layer extending in a first direction between the adjacent photo resist pattern features.

20. The method of claim 19, wherein a recess is formed at an end of the seam or void along the first direction, and the recess is located at a greater distance from the underlying layer along the first direction than an uppermost surface of the photo resist pattern.

* * * * *